(12) United States Patent
Cheng et al.

(10) Patent No.: US 9,748,419 B2
(45) Date of Patent: Aug. 29, 2017

(54) BACK CONTACT DESIGN FOR SOLAR CELL, AND METHOD OF FABRICATING SAME

(71) Applicant: TAIWAN SEMICONDUCTOR MANUFACTURING CO., LTD., Hsin-Chu (TW)

(72) Inventors: Tzu-Huan Cheng, Kaohsiung (TW); Chia-Hung Tsai, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/161,597

(22) Filed: May 23, 2016

(65) Prior Publication Data

US 2016/0268456 A1    Sep. 15, 2016

Related U.S. Application Data

(62) Division of application No. 14/061,803, filed on Oct. 24, 2013, now Pat. No. 9,368,659.

(51) Int. Cl.
| | |
|---|---|
| *H01L 21/00* | (2006.01) |
| *H01L 31/0224* | (2006.01) |
| *H01L 31/032* | (2006.01) |
| *H01L 31/0216* | (2014.01) |
| *H01L 31/0749* | (2012.01) |
| *H01L 31/18* | (2006.01) |
| *H01L 31/0392* | (2006.01) |

(52) U.S. Cl.
CPC ........... *H01L 31/022441* (2013.01); *H01L 31/02167* (2013.01); *H01L 31/022425* (2013.01); *H01L 31/0322* (2013.01); *H01L 31/0392* (2013.01); *H01L 31/0749* (2013.01); *H01L 31/1864* (2013.01); *H01L 31/1868* (2013.01); *Y02E 10/541* (2013.01); *Y02P 70/521* (2015.11)

(58) Field of Classification Search
CPC ............. H01L 31/02008; H01L 31/042; H01L 31/046; H01L 31/048; H01L 31/054; H01L 31/0203; H01L 31/0488; H01L 31/1868; H01L 31/02167; H01L 31/1864
USPC .............................. 438/57, 68; 136/244, 256
See application file for complete search history.

(56) References Cited

U.S. PATENT DOCUMENTS

| | | | | |
|---|---|---|---|---|
| 2012/0031428 | A1* | 2/2012 | Cheng | ........................ B08B 1/04 134/6 |
| 2013/0037093 | A1* | 2/2013 | Lee | .................... H01L 31/02242 136/256 |
| 2014/0124011 | A1* | 5/2014 | Mitzi | .................. G06Q 30/0202 136/244 |

OTHER PUBLICATIONS

Gatz, S. et al., "Analysis of local Al-doped back surface fields for high efficiency screen-printed solar cells", Energy Procedia, 2011, 8:318-323.

(Continued)

*Primary Examiner* — Brook Kebede
(74) *Attorney, Agent, or Firm* — Duane Morris LLP (57) ABSTRACT

A method includes depositing spacers at a plurality of locations directly on a back contact layer over a solar cell substrate. An absorber layer is formed over the back contact layer and the spacers. The absorber layer is partially in contact with the spacers and partially in direct contact with the back contact layer. The solar cell substrate is heated to form voids between the absorber layer and the back contact layer at the locations of the spacers.

20 Claims, 6 Drawing Sheets

(56) References Cited

OTHER PUBLICATIONS

Hsu, W.W. et al., "Surface passivation of Cu(In,Ga)Se2 using atomic layer deposited Al2O3", Appl. Phys. Lett. 2012,100, 023508, 4 pages.

Vermang, B. et al., "Development of rear surface passivated Cu(In,Ga)Se2 thin film solar cells with nano-sized local rear point contacts", Solar Energy Materials & Solar Cells, 2013, 117:505-511.

* cited by examiner

BACK CONTACT DESIGN FOR SOLAR CELL, AND METHOD OF FABRICATING SAME

This application is a division of U.S. patent application Ser. No. 14/061,803, filed Oct. 24, 2013, which is expressly incorporated by reference herein in its entirety.

FIELD

This disclosure relates to solar cells generally, and in particular to thin film photovoltaic cells and methods of fabricating the same.

BACKGROUND

Photovoltaic cells or solar cells are photovoltaic components for direct generation of electrical current from sunlight. Due to the growing demand for clean sources of energy, the manufacture of solar cells has expanded dramatically in recent years and continues to expand. Solar cells include a substrate, a back contact layer on the substrate, an absorber layer on the back contact layer, a buffer layer on the absorber layer, and a front contact layer above the buffer layer. The layers can be applied onto the substrate during a deposition process using, for example, sputtering and/or co-evaporation.

Semi-conductive materials are used in at least a portion of the absorber layer of some solar cells. For example, chalcopyrite based semi-conductive materials, such as copper indium gallium selenide (CIGS) (also known as thin film solar cell materials), are used to complete the formation of the absorber layer after the deposition process.

In semiconductor materials, the term "recombination," refers to a phenomenon in which an electron recombines with a hole giving off excess energy to a second electron instead of emitting the energy as a photon. The second electron (and successive electrons) then give up the additional energy in a series of collisions, relaxing back to the edge of the band. Thus, the effect is a result of interactions between multiple particles, including multiple electrons and a hole. The net effect is that many electron-hole pairs, which could otherwise generate useful power, recombine, and the charge carriers are eliminated.

Because recombination is based on the ability of the charge carriers to exchange energy, the probability of recombination increases with a higher concentration of charge carriers.

In highly concentrated sunlight, recombination significantly reduces solar cell efficiency.

DETAILED DESCRIPTION

This description of the exemplary embodiments is intended to be read in connection with the accompanying drawings, which are to be considered part of the entire written description. In the drawings, like reference numerals indicate like items.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

This disclosure describes a variety of photovoltaic cells, in which spacers or voids are provided directly on the top surface of the back contact layer. The spacers or voids reduce the contact area between the absorber layer and the back contact layer, providing a solar cell with reduced recombination and higher solar efficiency. Methods of fabricating the solar cells are also described.

Figure 1:
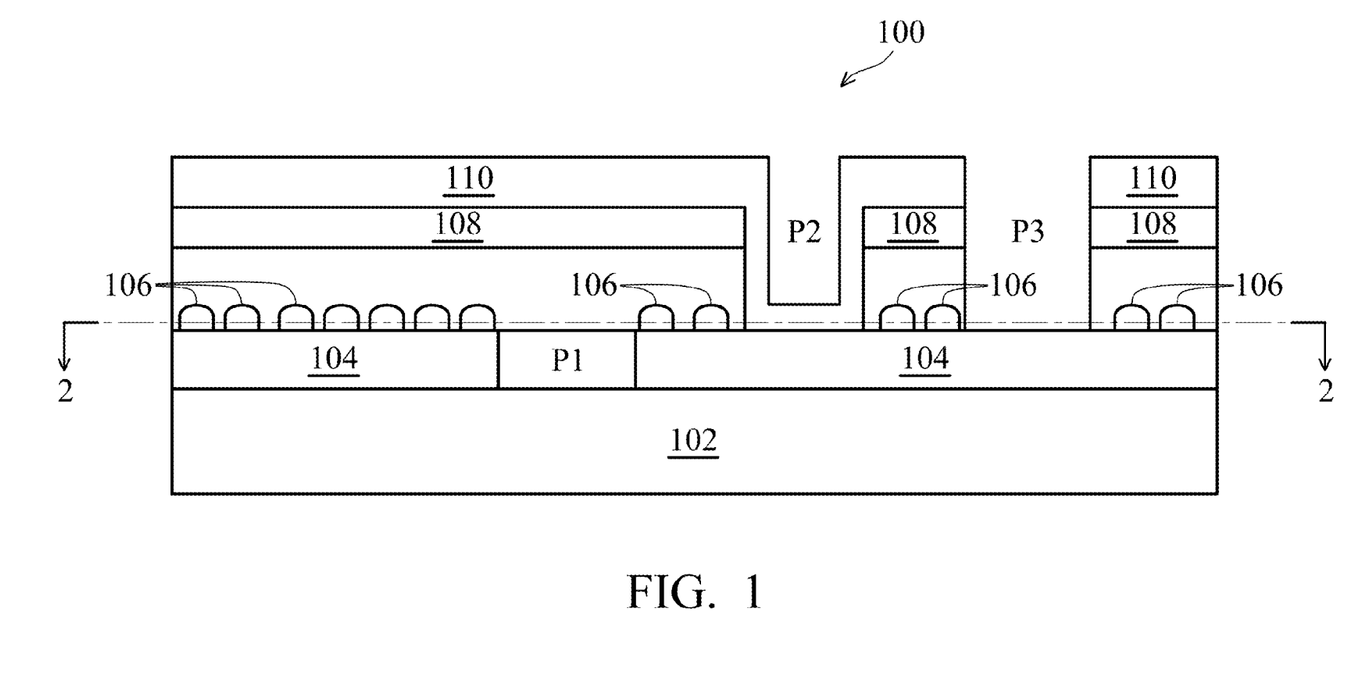
FIG. 1 is a cross sectional view of a solar cell according to an embodiment of this disclosure.

FIG. 1 is a cross sectional view of a solar cell 100 according to some embodiments. The solar cell 100 includes a solar cell substrate 102, a back contact layer 104, a an absorber layer 107, a plurality of voids 106 in the absorber layer, a buffer layer 108 and a front contact layer 110.

Substrate 102 can include any suitable substrate material, such as glass. In some embodiments, substrate 102 includes a glass substrate, such as soda lime glass, or a flexible metal foil or polymer (e.g., a polyimide, polyethylene terephthalate (PET), polyethylene naphthalene (PEN)). Other embodiments include still other substrate materials.

Back contact layer 104 includes any suitable back contact material, such as metal. In some embodiments, back contact layer 104 can include molybdenum (Mo), platinum (Pt), gold (Au), silver (Ag), nickel (Ni), or copper (Cu). Other embodiments include still other back contact materials. In some embodiments, the back contact layer 104 is from about 50 nm to about 2 µm thick.

In some embodiments, absorber layer 107 includes any suitable absorber material, such as a p-type semiconductor. In some embodiments, the absorber layer 107 can include a chalcopyrite-based material comprising, for example, Cu(In,Ga)Se$_2$ (CIGS), cadmium telluride (CdTe), CuInSe$_2$ (CIS), CuGaSe$_2$ (CGS), Cu(In,Ga)Se$_2$ (CIGS), Cu(In,Ga)(Se,S)$_2$ (CIGSS), CdTe or amorphous silicon. Other embodiments include still other absorber materials. In some embodiments, the absorber layer 107 is from about 0.3 µm to about 3 µm thick.

The absorber layer 107 contains a plurality of voids 106 directly on the top surface of the back contact layer. As used herein, the term "void in the absorber layer" refers to a volume 106 within the absorber layer 107, in which the absorber layer material is absent. In some embodiments, the voids 106 contain a vacuum. In some embodiments, the voids 106 contain a spacer material, described below. In some embodiments, the voids 106 contain one or more precursors for forming the spacer material. In some embodiments, the voids 106 contain one or more residual products from decomposition of the spacer material. In some embodiments, the voids include a combination of one or more of a vacuum, a spacer material, a spacer material precursor and/or a residual product of spacer material decomposition. Thus, the term "voids in the absorber" encompasses voids 106 in the absorber layer 107, with or without a material in the voids. The voids 106 provide insulating space or insulating material between portions of the absorber layer 107 and the underlying portions of the back contact layer 104. The voids 106 provide discontinuities in the conductive interface between the absorber layer 107 and the back contact layer 104.

In some embodiments, the voids 106 contain spacers formed of an insulating spacer material, such as an oxide. In some embodiments, the spacer material comprises silicon dioxide. In some embodiments, the spacer material comprises a metal oxide, such as TiO, TaO, $Al_2O_3$, $ZrO_2$, $MoO_2$, or $BaTiO_3$. In some embodiments, the spacer material comprises a high resistance compound semiconductor, such as $HfO_2$. In some embodiments, the spacer material comprises particles having sizes from about 50 nm to about 1,000 nm. In some embodiments, the spacer material comprises particles having sizes from about 100 nm to about 500 nm. In other embodiments, the spacer material comprises nanoparticles having sizes from about 1 nm to about 100 nm.

In some embodiments, from 10% to 80% of the bottom surface of the absorber layer 107 contacts the voids 106 or spacers within the voids. In some embodiments, from about 90% to about 20% of a bottom surface of the absorber layer 107 is in direct contact with the back contact layer 104, and a remainder of the absorber layer 107 confronts either voids 106 or insulating spacers within the voids.

In some embodiment, the spacers cover from about 70% to about 80% of the back contact layer 104 with spacer material, and about 30% to about 20% of the absorber layer 107 in direct contact with the underlying back contact layer 104. The inventors have determined that a solar cell 100 having about 80% of the absorber layer 107 abutting the voids 106 and about 20% of the absorber layer directly contacting the back contact layer has a solar module efficiency that is about 105% to 106% of the solar module efficiency of an otherwise similar solar cell having no voids 106 in the absorber layer 107. The solar cell 100 having about 80% of the absorber layer 107 abutting the voids 106 and about 20% of the absorber layer directly contacting the back contact layer 104 has no increase in the risk of absorber delamination.

Buffer layer 108 includes any suitable buffer material, such as n-type semiconductors. In some embodiments, buffer layer 108 can include cadmium sulphide (CdS), zinc sulphide (ZnS), zinc selenide (ZnSe), indium (III) sulfide ($In_2S_3$), indium selenide ($In_2Se_3$), or $Zn_{1-x}Mg_xO$, (e.g., ZnO). Other embodiments include still other buffer materials. In some embodiments, the buffer layer 108 is from about 1 nm to about 500 nm thick.

In some embodiments, front contact layer 110 includes an annealed transparent conductive oxide (TCO) layer. In some embodiments, the TCO layer 110 is highly doped. For example, the charge carrier density of the TCO layer 110 can be from about $1\times10^{17}$ $cm^{-3}$ to about $1\times10^{18}$ $cm^{-3}$. The TCO material for the annealed TCO layer can include any suitable front contact material, such as metal oxides and metal oxide precursors. In some embodiments, the TCO material can include zinc oxide (ZnO), cadmium oxide (CdO), indium oxide ($In_2O_3$), tin dioxide ($SnO_2$), tantalum pentoxide ($Ta_2O_5$), gallium indium oxide ($GaInO_3$), ($CdSb_2O_3$), or indium oxide (ITO). The TCO material can also be doped with a suitable dopant. In some embodiments, ZnO can be doped with any of aluminum (Al), gallium (Ga), boron (B), indium (In), yttrium (Y), scandium (Sc), fluorine (F), vanadium (V), silicon (Si), germanium (Ge), titanium (Ti), zirconium (Zr), hafnium (Hf), magnesium (Mg), arsenic (As), or hydrogen (H). In other embodiments, SnO2 can be doped with antimony (Sb), F, As, niobium (Nb), or tantalum (Ta). In other embodiments, $In_2O_3$ can be doped with tin (Sn), Mo, Ta, tungsten (W), Zr, F, Ge, Nb, Hf, or Mg. In other embodiments, CdO can be doped with In or Sn. In other embodiments, GaInO3 can be doped with Sn or Ge. In other embodiments, $CdSb_2O_3$ can be doped with Y. In other embodiments, ITO can be doped with Sn. Other embodiments include still other TCO materials and corresponding dopants. In some embodiments, the front contact layer 110 is from about 5 nm to about 3 μm thick outside of the P2 scribe line, from about 0.5 nm to about 3 μm on side walls of the P2 scribe line, and from about 5 nm to about 3 μm on the bottom of the P2 scribe line (directly on the back contact layer 104).

Solar cell 100 also includes interconnect structures that include three scribe lines, referred to as P1, P2, and P3. The P1 scribe line extends through the back contact layer 104 and is filled with the absorber layer material. The P2 scribe line extends through the buffer layer 108 and the absorber layer 107 and is filled with the front contact layer material. The P3 scribe line extends through the front contact layer 110, buffer layer 108 and absorber layer 107.

Figure 2:
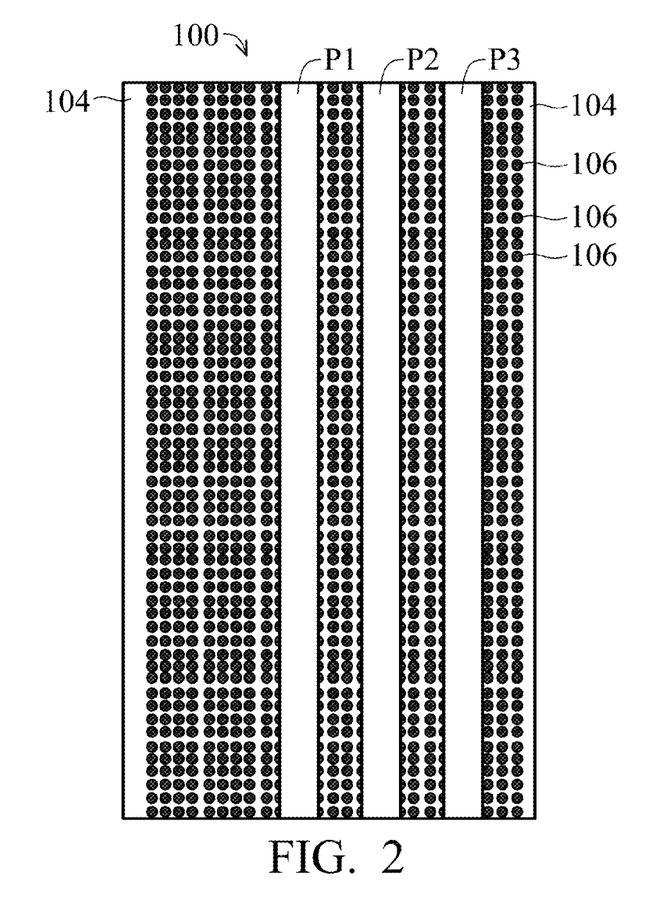
FIG. 2 is a cross sectional view of the solar cell of FIG. 1, taken across section line 2-2 of FIG. 1, according to some embodiments.

FIG. 2 is a cross-sectional view of the solar cell 100 taken along section line 2-2 of FIG. 1, looking down on the back contact layer 104 and voids 106. The absorber layer 107 comprises an absorber layer material over the back contact layer 104, where the absorber layer material is partially in direct contact with the back contact layer 104, and the absorber layer material has a plurality of voids 106 therein. The voids 106 are located directly on the back contact layer 104.

In the embodiment of FIG. 2, the voids 106 are distributed uniformly or substantially uniformly over the top surface of the back contact layer 104 (except in the scribe line regions P1, P2 and P3). A uniform distribution of voids 106 as shown in FIG. 2 can be formed by depositing a uniform spacer material film and performing a photolithography step, as discussed below in the description of FIG. 6B. A uniform distribution of voids 106 provides good process control. In some embodiments, the spacer density is in a range from $1\times10^8$ to $4\times10^{10}$ spacers/$cm^2$.

Figure 3:
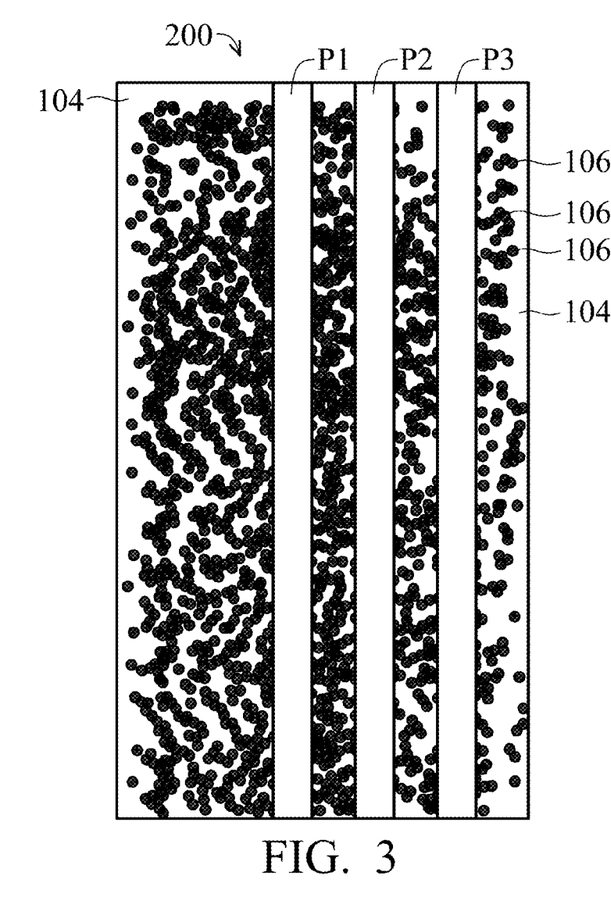
FIG. 3 is a cross sectional view of the solar cell of FIG. 1, taken across section line 2-2 of FIG. 1, according to other embodiments.

FIG. 3 shows another embodiment of a solar cell 200, in which the voids are randomly distributed over the top surface of the back contact layer 104 (except in the scribe line regions P1, P2 and P3). A random distribution of voids 106 as shown in FIG. 3 can be formed by spraying a spacer material directly on the back contact layer 104, as discussed below in the description of FIG. 6A. The spacer density for a sprayed spacer material can be the same as for a patterned spacer material, for example, in a range from $1\times10^8$ to $4\times10^{10}$ spacers/$cm^2$. Randomly distributed spacer material can be deposited inexpensively by a spraying process.

Figure 4:
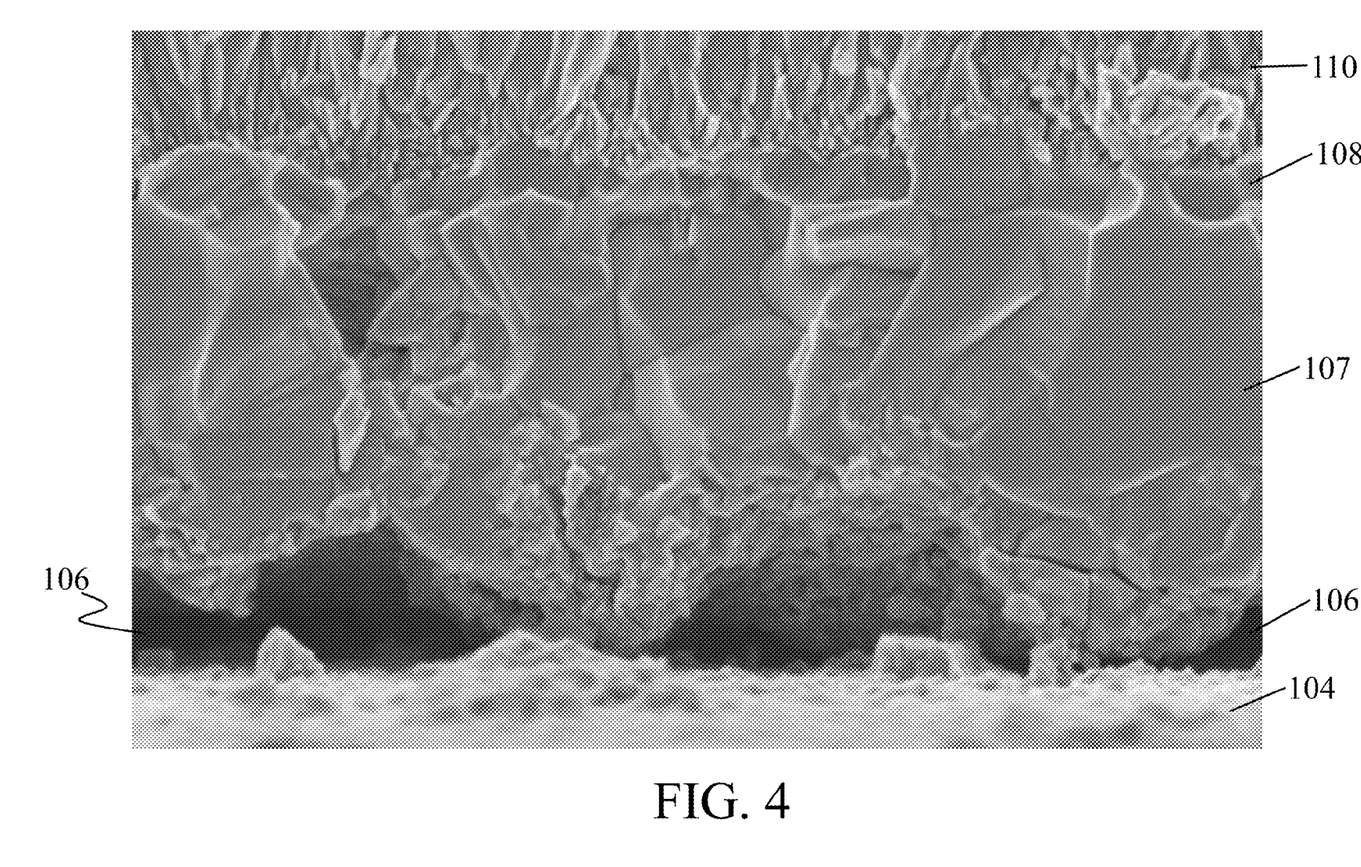
FIG. 4 is a scanning electron microscope photograph showing the layers of the solar cell of FIG. 1.

FIG. 4 is a scanning electron microscope (SEM) image showing a detail of the cross section of the solar cell 100 of FIG. 1. The back contact layer 104, voids 106, absorber layer 107, buffer layer 108 and front contact layer 110 are shown. In FIG. 4, the voids 106 are substantially free of solid materials. In some embodiments, the spacer material deposited on the back contact layer 104 is an insulating material having an evaporation temperature below the processing temperatures used when depositing and/or annealing one or more of the remaining layers (absorber layer 107, buffer layer 108, front contact layer 110). For example, if the vaporization temperature of the spacer material is at or below 400° C. (or at or below 600° C.), then the spacer material can be substantially removed from the interface between the absorber 107 and the back contact layer 104, leaving vacant voids 106, as shown in FIG. 4. The remaining direct contact area between the absorber 107 and the back contact layer 104 occupies more than 5% of the total surface area of the back contact layer 104. In some embodiments, the remaining direct contact area between the absorber 107 and the back contact layer 104 occupies more than 10% of the total surface area of the back contact layer 104. In some embodiments, the remaining direct contact area between the absorber 107 and the back contact layer 104 occupies about 20% of the total surface area of the back contact layer 104.

Figure 5:
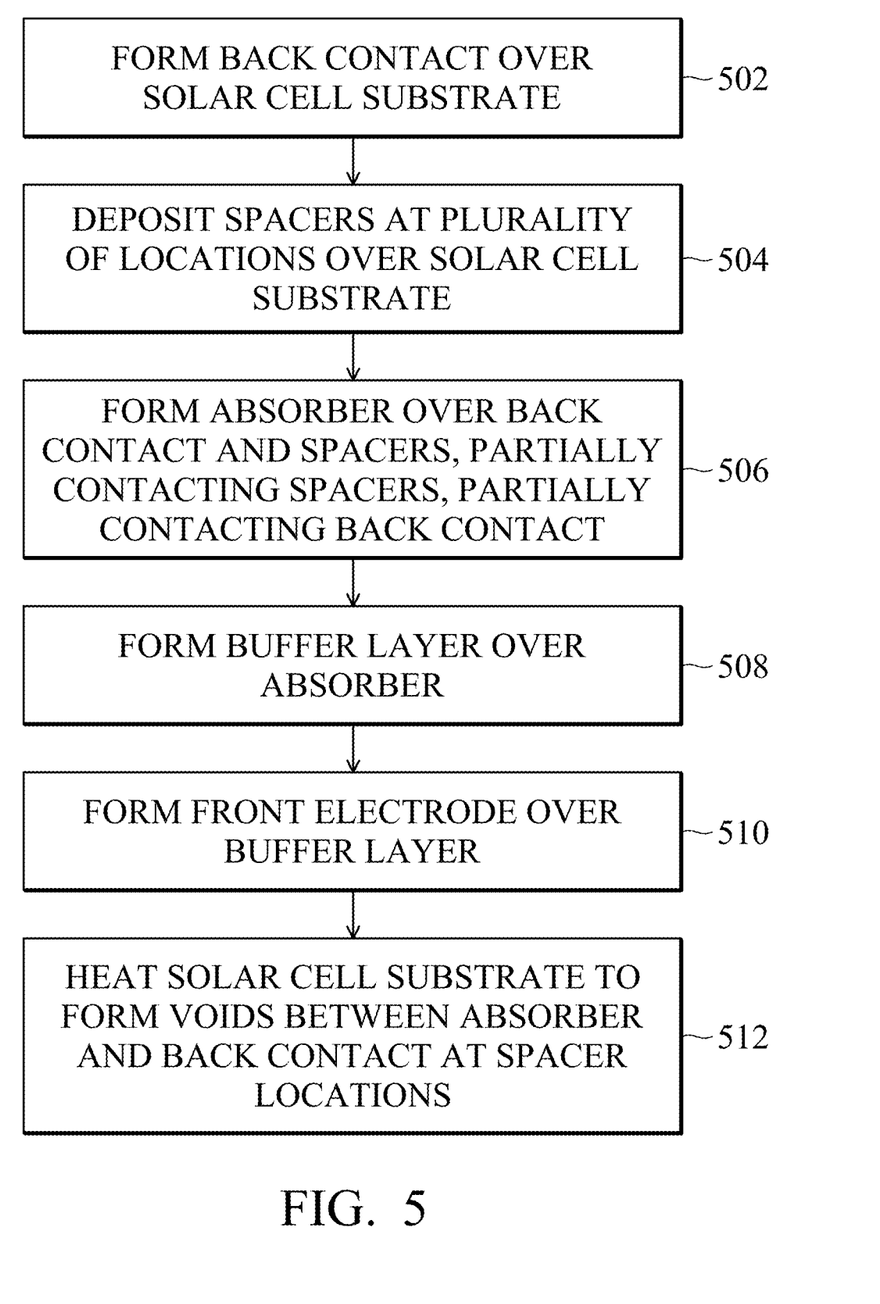
FIG. 5 is a flow chart of a method of fabricating the solar cell of FIG. 1.

FIG. 5 is a flow chart of a method of fabricating the solar cell 100 of FIG. 1.

At step 502, a back contact layer 104 is formed over a solar cell substrate. In some the back contact layer 104 can deposited by sputtering a metal such as molybdenum over the solar cell substrate 102. At the conclusion of back contact layer deposition, the P1 scribe line is formed (e.g., scribed or etched) through the back contact layer 104.

At step 504, spacers 106 are deposited at a plurality of locations directly on the back contact layer 104 over the solar cell substrate 102. Details of some embodiments of the spacer deposition step are provided below with reference to FIGS. 6A and 6B.

At step 506, the absorber layer 107 is formed over the back contact 104 and spacers 106. The bottom of absorber layer 107 partially contacts the spacers 106 and partially contacts the back contact layer 104. In some embodiments, the absorber comprises CIGS. In some embodiments, a plurality of CIGS precursors are sputtered onto the spacers 106 and exposed portion of the back contact layer 104. In some embodiments, the CIGS precursors include Cu/In, CuGa/In and/or CuInGa, applied by sputtering. The absorber layer material fills the P1 scribe line. Following the sputtering of these precursors, selenization is performed.

At step 508, the buffer layer 108 is formed over the absorber layer 107. For example, in some embodiments, a layer of CdS, ZnS or InS is formed by chemical bath deposition (CBD). In other embodiments, the buffer layer 108 is deposited by sputtering or atomic layer deposition (ALD). Following the deposition of the buffer layer 108, the P2 scribe line is formed (e.g., scribed or etched) through the absorber layer 107 and buffer layer 108.

At step 510, the front contact layer 110 is formed over the buffer layer. In some embodiments, the front contact layer 110 is i-ZnO or AZO applied by sputtering. In other embodiments, the front contact layer 110 is BZO applied by metal organic chemical vapor deposition (MOCVD). The front contact layer material conformally coats the side and bottom walls of the P2 scribe line. Following deposition of the front contact layer 110, the P3 scribe line is formed (e.g., scribed or etched) through the front contact layer, buffer layer 108, and absorber layer 107.

At step 512, in some embodiments the solar cell substrate 102 is heated to form voids 106 between the absorber layer 107 and the back contact layer 104 at the locations of the spacers. In some embodiments, the heating step includes heating the substrate to a temperature from about 400° C. to about 600° C. In some embodiments, the heating step 512 is accomplished by an annealing step. In some embodiments, the heating step 512 is included in a step of annealing the front contact (window) layer 110. Thus, the heating step 512 can be achieved without adding an additional annealing step to the solar cell fabrication process. In some embodiments, following the heating step, the voids 106 contain a vacuum, a spacer material, a spacer material precursor, a spacer material decomposition residual product, or a combination of the above. For example, in some embodiments, after the annealing step, the voids 106 only contain a vacuum or a spacer material decomposition residual product at a low (partial vacuum) pressure.

Figure 6A:
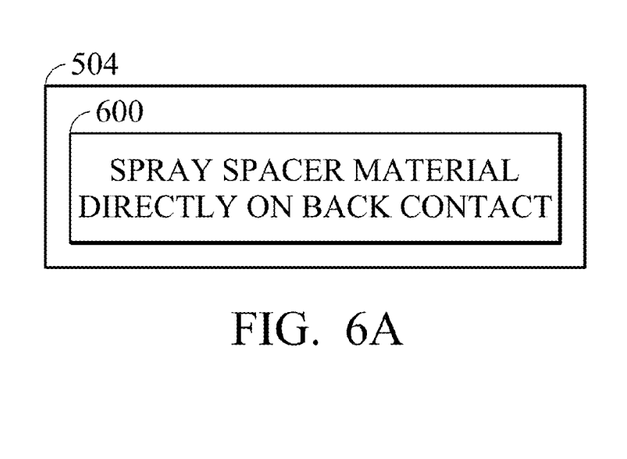
FIG. 6A is a flow chart of one embodiment of the spacer deposition step in FIG. 5.

FIG. 6A is a flow chart showing an embodiment of step 504 of FIG. 5. In FIG. 6A, step 504 includes step 600 of spring spacer material directly on the back contact layer 104. In some embodiments, the spacer material particles 106 have sizes from about 100 nm to about 500 nm. In some embodiments, the step of depositing spacers 106 includes spraying nanoparticles on the back contact layer. In some embodiments, the step of depositing spacers 106 includes spraying silicon dioxide particles having sizes from about 100 nm to about 500 nm on about 70% to about 80% of the back contact layer 104.

The step of spraying spacer material can be integrated with the solar cell production line. For example, in some embodiments, the spraying is performed by one or more nozzles within the same process chamber in which the back contact layer 104 is deposited. A plurality of nozzles can be used to improve the uniformity of the spacer particles.

Figure 6B:
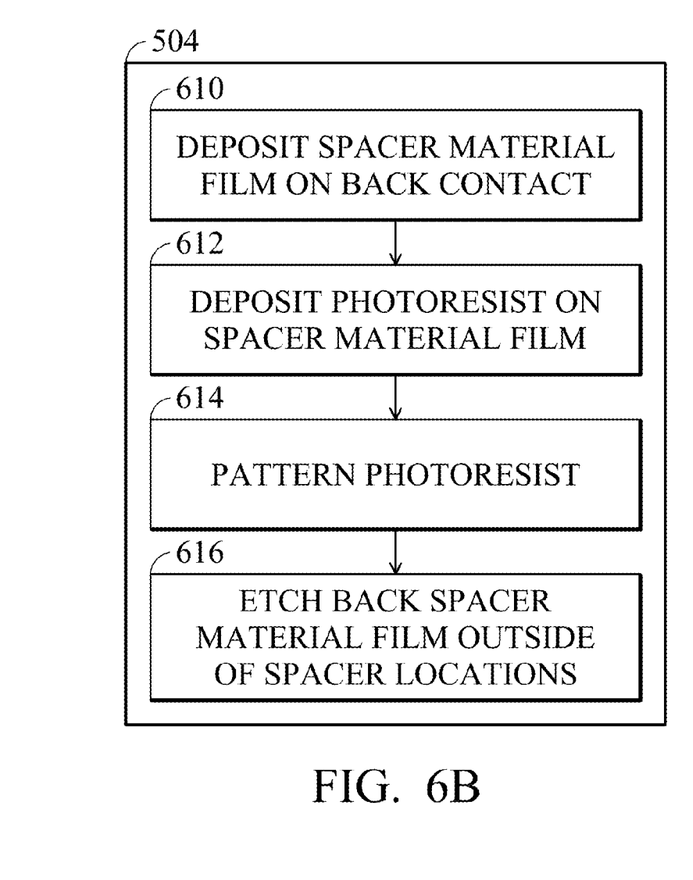
FIG. 6B is a flow chart of another embodiment of the spacer deposition step in FIG. 5.

FIG. 6B is a flow chart of an alternative embodiment of step 504 of FIG. 5. In the embodiment of FIG. 6B, step 504 includes steps 610-616.

At step 610, a spacer material film is deposited on the back contact layer 104. In some embodiments, the spacer material film is deposited uniformly. Uniform material deposition processes can include one or more of physical vapor deposition (PVD), chemical vapor deposition (CVD), sputtering, ALD, epitaxial formation, or the like. In some embodiments, a uniform silicon dioxide film is deposited.

At step 612, a photoresist is deposited on the spacer material film.

At step 614, the photoresist is patterned. The photoresist is selectively exposed through a photomask, and the exposed photoresist is developed and baked. A positive or negative photoresist can be used, with the appropriate photomask. The portions of the photoresist in the spacer locations is rendered (or remains) insoluble, and the portions of the photoresist outside of the spacer locations is rendered (or remains) soluble. The soluble photoresist is dissolved and removed, leaving a hard mask comprising resist portions in the spacer locations.

At step 616, the spacer material film is etched back outside of the spacer locations, leaving a uniform field of spacers 106, as shown in FIG. 2.

Figure 7:
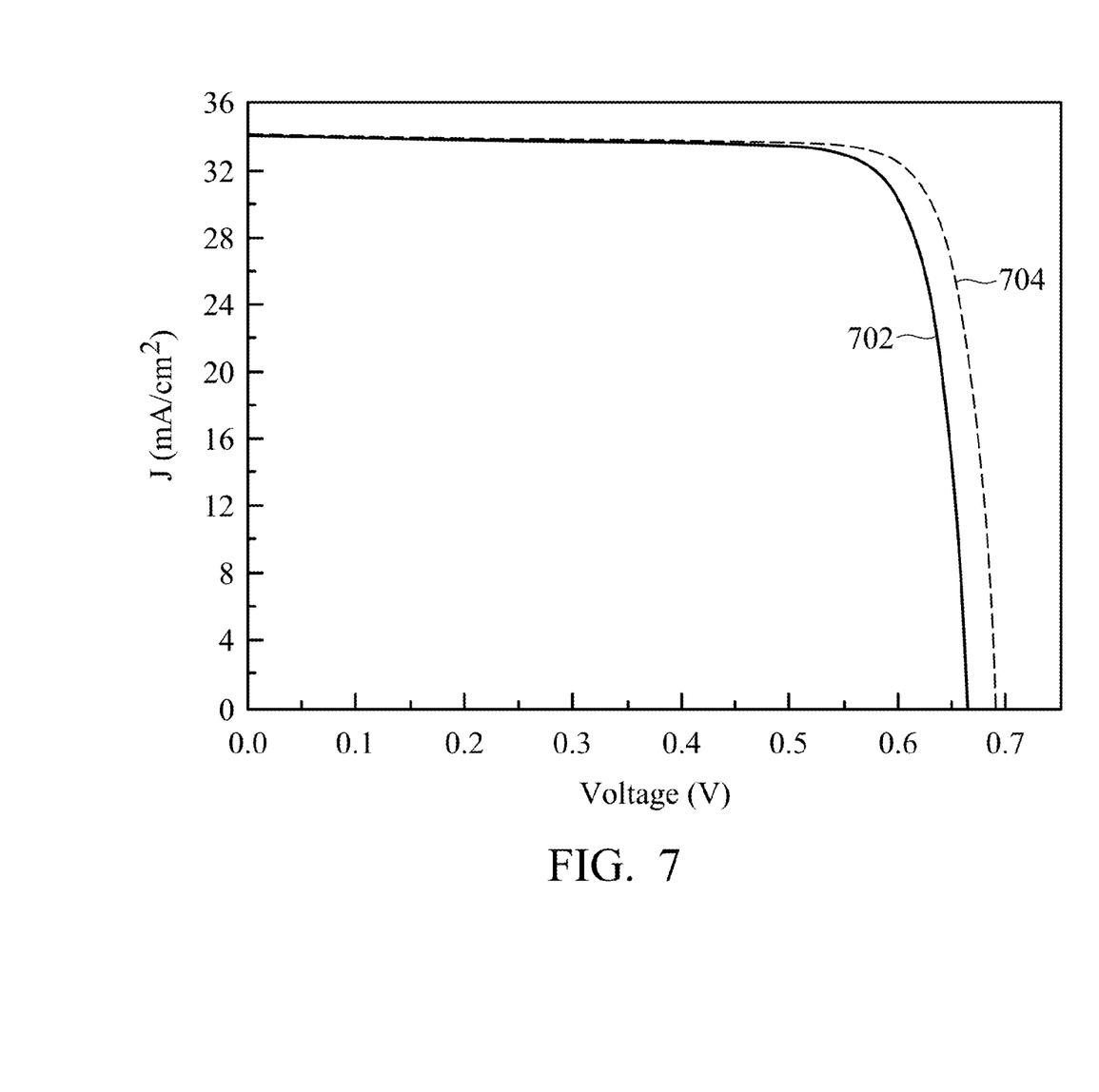
FIG. 7 is a diagram showing improved power generation by the solar cell of FIG. 1.

FIG. 7 is a diagram showing the open circuit voltage (Voc) improvement due to the inclusion of the voids and/or spacers 106 directly on the back contact layer, underlying a portion of the absorber layer. Curve 702 corresponds to a solar cell without the voids/spacers described above. Curve 704 corresponds to a solar cell with the voids/spacers described above.

Table 1 summarizes relevant performance data comparing the solar cells without and with the voids/spacers.

TABLE 1

|  | CdS/CIGS Seff (cm/s) | Jsc (mA/cm2) | Voc (V) | F.F. (%) | Eff. (%) |
|---|---|---|---|---|---|
| With voids/spacers | 100 | 34.11 | 0.6907 | 82.98 | 19.55 |

TABLE 1-continued

| | CdS/CIGS Seff (cm/s) | Jsc (mA/cm2) | Voc (V) | F.F. (%) | Eff. (%) |
|---|---|---|---|---|---|
| No voids/spacers | 100,000 | 33.97 | 0.6657 | 81.95 | 18.54 |

The first data column of Table 1 (CdS/CIGS Seff (cm/s)) provides surface recombination velocity (Seff) for the solar cell of FIG. 1 (with voids/spacers) and a control solar cell (no voids/spacers). Recombination velocity on a semiconductor surface is defined as the ratio of the normal component of the electron (or hole) current density at the surface to the excess electron (or hole) charge density at the surface. The portion of the graph corresponding to the current density range (along the Y-axis) from about 32 to 37 (corresponding to the level of illumination from the sun) is of particular interest. The value of Seff with spacers is about 100 cm/s, and the value of Seff with no spacers is about 100,000 cm/s. Thus, the inclusion of spacers reduces surface recombination velocity by three orders of magnitude. Table 1 further shows that the short circuit current Jsc is improved from 33.97 mA/cm$^2$ without voids/spacers to 34.11 mA/cm$^2$ with voids/spacers. Open circuit voltage Voc increases from 0.6657 V without voids/spacers to 0.6907 V with voids/spacers. The fill factor increases from 0.8195 without voids/spacers to 0.8298 with voids/spacers. The fill factor is defined as the ratio of the actual maximum obtainable power to the product of the open circuit voltage and short circuit current. The fill factor describes the curvature of the current/voltage curves 702, 704, and higher fill factor is an indicator of improved performance.

Because recombination removes electron-hole pairs from the absorber, this 1,000× reduction in recombination velocity can increase overall solar cell efficiency (Eff.) from 18.54% (without voids/spacers) to 19.55%. This represents about a 5.4% improvement in solar cell efficiency.

Examples are described above for providing voids/spacers directly in contact with the back contact layer 104 of a p-n junction type solar cell. The void/spacer method described herein can be used with other thin film solar cells, including but not limited to a-Si thin film solar cells, CIGS and CdTe solar cells with p-n junctions, p-intrinsic-n (p-i-n) structure, metal-insulator-semiconductor (MIS) structure, multijunction (e.g., p-n-p-n or p-n-p-n-p-n structure with two or three absorbers stacked in series), or the like.

In some embodiments, a method comprises: depositing spacers at a plurality of locations directly on a back contact layer over a solar cell substrate; forming an absorber layer over the back contact layer and the spacers, the absorber layer partially in contact with the spacers and partially in direct contact with the back contact layer; and heating the solar cell substrate to form voids between the absorber layer and the back contact layer at the locations of the spacers.

In some embodiments, the step of depositing spacers includes spraying spacer material particles on the back contact layer.

In some embodiments, the spacer material comprises a metal oxide.

In some embodiments, the spacer material comprises silicon dioxide.

In some embodiments, the spacer material particles have sizes from about 100 nm to about 500 nm.

In some embodiments, step of depositing spacers includes spraying nanoparticles on the back contact layer.

In some embodiments, the step of depositing spacers includes: depositing a silicon dioxide film on the back contact layer; and using photolithography to remove portions of the silicon dioxide film outside of the locations of the spacers.

In some embodiments, the step of depositing spacers includes covering from about 70% to about 80% of the back contact layer with spacer material.

In some embodiments, the heating step includes heating the substrate to a temperature from about 400° C. to about 600° C.

In some embodiments, the step of depositing spacers includes spraying silicon dioxide particles having sizes from about 100 nm to about 500 nm on about 70% to about 80% of the back contact layer; and the heating step includes heating the substrate to a temperature from about 400° C. to about 600° C.

In some embodiments, a method comprises: spraying spacer material at a plurality of locations directly on a back contact layer over a solar cell substrate; and forming an absorber layer over the back contact layer and the spacer material, so that from about 10% to about 80% of the absorber layer is in direct contact with the spacer material and from about 90% to about 20% of the absorber layer is in direct contact with the back contact layer.

Some embodiments further comprise heating the solar cell substrate to form voids between the absorber layer and the back contact layer at the locations of the spacers.

In some embodiments, the spacer material comprises silicon dioxide.

In some embodiments, the spacer material comprises particles having sizes from about 100 nm to about 500 nm.

In some embodiments, a solar cell, comprises: a solar cell substrate; a back contact layer over the solar cell substrate; an absorber layer comprising an absorber layer material over the back contact layer, the absorber layer material partially in direct contact with the back contact layer, the absorber layer material having a plurality of voids therein, the voids located directly on the back contact layer; a buffer layer over the absorber layer; and a front contact layer over the buffer layer.

Some embodiments further comprise spacers directly on the back contact layer within the plurality of voids.

In some embodiments, the spacers comprise an insulating material.

In some embodiments, the spacers comprise particles having sizes from about 100 nm to about 500 nm.

In some embodiments, from about 20% to about 90% of a bottom surface of the absorber layer is in direct contact with the back contact layer, and a remainder of the absorber layer confronts at least one of the group consisting of the voids or insulating spacers in the voids.

In some embodiments, the voids are randomly distributed on the back contact layer.

Although the subject matter has been described in terms of exemplary embodiments, it is not limited thereto. Rather, the appended claims should be construed broadly, to include other variants and embodiments, which may be made by those skilled in the art.

What is claimed is:
1. A solar cell, comprising:
    a solar cell substrate;
    a back contact layer over the solar cell substrate;
    an absorber layer comprising an absorber layer material over the back contact layer, the absorber layer material partially in direct contact with the back contact layer, the absorber layer material having a plurality of voids therein, the voids located directly on the back contact layer;

a buffer layer over the absorber layer; and a front contact layer over the buffer layer.

2. The solar cell of claim 1, further comprising spacers directly on the back contact layer within the plurality of voids.

3. The solar cell of claim 2, wherein the spacers comprise an insulating material.

4. The solar cell of claim 2, wherein the spacers comprise particles having sizes from about 100 nm to about 500 nm.

5. The solar cell of claim 2, wherein the spacers comprise a metal oxide.

6. The solar cell of claim 2, wherein the spacers comprise a silicon dioxide.

7. The solar cell of claim 1, wherein from about 20% to about 90% of a bottom surface of the absorber layer is in direct contact with the back contact layer, and a remainder of the absorber layer confronts at least one of the group consisting of the voids or insulating spacers in the voids.

8. The solar cell of claim 7, wherein about 20% of a bottom surface of the absorber layer is in direct contact with the back contact layer.

9. The solar cell of claim 1, wherein the voids are randomly distributed on the back contact layer.

10. The solar cell of claim 1, wherein the voids are substantially uniformly distributed on the back contact layer.

11. The solar cell of claim 1, wherein the voids are distributed on the back contact layer with a density in a range from $1\times10^8$ to $4\times10^{10}$ spacers/cm$^2$.

12. A solar cell, comprising:
a solar cell substrate;
a back contact layer over the solar cell substrate;
an absorber layer comprising an absorber layer material over the back contact layer, the absorber layer material partially in direct contact with the back contact layer, the absorber layer material having a plurality of voids therein, the voids randomly distributed directly on the back contact layer;
a buffer layer over the absorber layer; and
a front contact layer over the buffer layer.

13. The solar cell of claim 12, further comprising spacers directly on the back contact layer within the plurality of voids.

14. The solar cell of claim 13, wherein the spacers comprise particles having sizes from about 100 nm to about 500 nm.

15. The solar cell of claim 13, wherein the spacers comprise an insulating material.

16. A solar cell, comprising:
a solar cell substrate;
a back contact layer over the solar cell substrate;
an absorber layer comprising an absorber layer material over the back contact layer, the absorber layer material partially in direct contact with the back contact layer, the absorber layer material having a plurality of voids therein, the voids uniformly distributed directly on the back contact layer;
a buffer layer over the absorber layer; and
a front contact layer over the buffer layer.

17. The solar cell of claim 16, further comprising spacers directly on the back contact layer within the plurality of voids.

18. The solar cell of claim 17, wherein the spacers comprise particles having sizes from about 100 nm to about 500 nm.

19. The solar cell of claim 17, wherein the spacers comprise an insulating material.

20. The solar cell of claim 16, wherein from about 20% to about 90% of a bottom surface of the absorber layer is in direct contact with the back contact layer, and a remainder of the absorber layer confronts at least one of the group consisting of the voids or insulating spacers in the voids.

* * * * *